(12) United States Patent
Liang et al.

(10) Patent No.: US 6,897,157 B2
(45) Date of Patent: May 24, 2005

(54) METHOD OF REPAIRING AN OPAQUE DEFECT ON A MASK WITH ELECTRON BEAM-INDUCED CHEMICAL ETCHING

(75) Inventors: Ted Liang, Sunnyvale, CA (US); Alan Stivers, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 70 days.

(21) Appl. No.: 10/659,961

(22) Filed: Sep. 10, 2003

(65) Prior Publication Data

US 2004/0048398 A1 Mar. 11, 2004

Related U.S. Application Data

(62) Division of application No. 09/895,511, filed on Jun. 29, 2001.

(51) Int. Cl.[7] .............................................. H01L 21/302
(52) U.S. Cl. ......................................................... 438/710
(58) Field of Search ............................. 438/710; 430/5; 510/376

(56) References Cited

U.S. PATENT DOCUMENTS

| | | | |
|---|---|---|---|
| 5,741,557 A | 4/1998 | Corbin et al. | |
| 5,973,295 A | 10/1999 | Corbin et al. | |
| 6,042,738 A | 3/2000 | Casey, Jr. et al. | |
| 6,340,543 B1 * | 1/2002 | Nagamura et al. | 430/5 |
| 6,548,417 B2 * | 4/2003 | Dao et al. | 438/710 |
| 6,583,098 B1 * | 6/2003 | Cassie | 510/376 |
| 6,610,447 B2 * | 8/2003 | Yan et al. | 430/5 |

* cited by examiner

Primary Examiner—John F. Niebling
Assistant Examiner—Andre' Stevenson
(74) Attorney, Agent, or Firm—George Chen

(57) ABSTRACT

The present invention discloses a method of fabricating and repairing a mask without damage and an apparatus including a holder to mount a substrate; a stage to position the holder in a chamber; a pumping system to evacuate the chamber; an imaging system to locate an opaque defect in the substrate; a gas delivery system to dispense a reactant gas towards the defect; and an electron delivery system to direct electrons towards the opaque defect.

5 Claims, 3 Drawing Sheets

METHOD OF REPAIRING AN OPAQUE DEFECT ON A MASK WITH ELECTRON BEAM-INDUCED CHEMICAL ETCHING

This is a Divisional Application of Ser. No. 09/895,511, filed Jun. 29, 2001, which is presently pending.

BACKGROUND OF THE INVENTION

1. Field of the Invention

The present invention relates to the field of semiconductor integrated circuit manufacturing, and more specifically, to a method of fabricating and repairing a mask with electron beam-induced chemical etching.

2. Discussion of Related Art

After coating photoresist on a semiconductor wafer, a scanner may be used to expose the photoresist to radiation, such as deep ultraviolet (DUV) light with nominal wavelength of 248 nanometers (nm), 193 nm, or 157 nm. The wafer is sub-divided into contiguous identical fields and a reduction projection system is used to scan light across a mask and onto each field. One or more integrated circuit (IC) chips is fabricated in each field. The mask, which may be transmissive or reflective, determines the pattern to be transferred to the photoresist as a result of the exposure followed by a develop process.

Using a Phase-Shifting Mask (PSM) and Optical Proximity Correction (OPC) with DUV light will allow printing of features with a critical dimension (CD) of 100–180 nm. However, Next Generation Lithography (NGL) is required to print features with even smaller CD. Extreme Ultraviolet (EUV) lithography, a leading candidate for NGL, uses exposure light with a central wavelength in the range of 10–15 nm.

An EUV scanner may have 4 imaging mirrors and a Numerical Aperture (NA) of 0.10 to achieve a CD of 50–70 nm with a depth of focus (DOF) of about 1.00 micrometer (um). Alternatively, an EUV scanner may have 6 imaging mirrors and a NA of 0.25 to print a CD of 20–30 nm with a reduction in DOF to about 0.17 um.

A DUV or EUV mask is inspected for defects during fabrication. Repair of critical defects is performed with a focused ion beam (FIB) tool having a Gallium liquid metal ion source. A clear defect is covered up by depositing Carbon or a metal, followed by trimming with gas-assisted etch (GAE). An opaque defect is repaired with physical ion sputtering or GAE with ion bombardment. The process to remove opaque defects should have adequate etch selectivity to the underlying layer. The underlying layer is quartz in a transmissive mask for DUV or a buffer layer in a reflective mask for EUV.

FIB may damage a mask during the scan to search for defects or during the repair of defects. The repaired portions of the mask may be roughened by sputtering. Organic contamination may be deposited on the surface of the mask. Gallium ions may be implanted into underlying layers. Gallium absorbs strongly at 157 nm and at EUV wavelengths, thus decreasing the transmission in a transmissive mask, such as a 157 nm DUV mask, or decreasing the reflectivity in a reflective mask, such as an EUV mask. Underlying layers of the mask may be further damaged by knock-on of atoms by Gallium.

Damage to a mask becomes more problematic as the CD of the features on the mask shrinks. Lowering the acceleration voltage in the FIB will reduce the penetration range of Gallium ions, but etch selectivity and spatial resolution are compromised. Limiting imaging time and overscan area can reduce damage, but repair may also be adversely affected. Post-repair treatment, such as wet etch of the quartz substrate in a 157 nm DUV mask or the buffer layer in an EUV mask, will remove implanted Gallium ions, but the underlying material may become pitted. If sufficient material is removed, a phase error may also be introduced.

Thus, what is needed is an apparatus for and a method of fabricating and repairing a mask without damage.

BRIEF DESCRIPTION OF THE DRAWINGS

FIGS. 1(a)–(d) are illustrations of a cross-sectional view of an EUV mask blank formed according to the present invention.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

A mask is used in lithography to print a desired pattern in photoresist on a wafer. Deep ultraviolet (DUV) lithography uses a transmissive mask for exposure with light having a wavelength of 248 nm, 193 nm, or 157 nm. Extreme ultraviolet (EUV) lithography uses a reflective mask for exposure since nearly all condensed materials are highly absorbing in the EUV wavelength range of 11–15 nm.

The desired pattern is defined in a DUV mask by selectively removing portions of an opaque Chrome layer to uncover a transparent quartz substrate. The desired pattern is defined in an EUV mask by selectively removing portions of an absorber layer to uncover a multilayer mirror on a substrate.

A DUV mask or an EUV mask is inspected for defects as part of the mask fabrication process. The inspection is usually done with DUV light. A defect may appear clear or opaque. A defect is considered critical if its size, shape, or location may significantly affect the print fidelity and quality of the mask features in the vicinity. A critical defect must be repaired or else the yield may be degraded on the structure being fabricated with the mask. The present invention includes an apparatus for and a method of repairing opaque defects on a DUV mask or an EUV mask without damage to underlying layers.

Figure 1A:
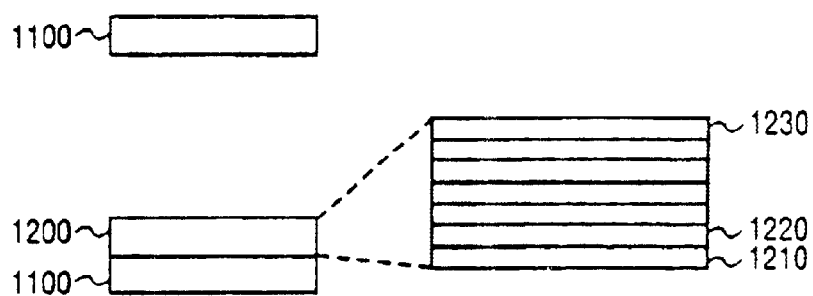

Various embodiments of a method of fabricating and repairing an EUV mask according to the present invention will be described. First, a substrate 1100 having a low coefficient of thermal expansion (CTE), a smooth surface, and a low defect level is used as the starting material for an EUV mask of the present invention. An embodiment is shown in FIG. 1(a). The substrate 1100 may be formed out of a glass-ceramic material with the desired properties.

Second, a multilayer (ML) mirror 1200 is formed over the substrate 1100 since an EUV mask operates on the principle of a distributed Bragg reflector. An embodiment is shown in FIG. 1(b). The ML mirror 1200 includes about 20–80 pairs of alternating layers of a high index of refraction material 1210 and a low index of refraction material 1220. The thickness uniformity should be better than 0.8% across the substrate 1100.

In one embodiment, the ML mirror 1200 includes 40 pairs of alternating layers of a high index of refraction material 1210 and a low index of refraction material 1220. The high index of refraction material 1210 may be formed from about 2.8 nm thick Molybdenum while the low index of refraction material 1220 may be formed from about 4.1 nm thick Silicon. As needed, a capping layer 1230, such as about 11.0 nm thick Silicon, may be formed over the ML mirror 1200 to prevent oxidation of Molybdenum at the upper surface of the ML mirror 1200 in an EUV mask. The ML mirror 1200 can achieve a peak reflectivity of about 60–75% at the EUV central illumination wavelength of about 13.4 nm.

Ion beam deposition (IBD) or direct current (DC) magnetron sputtering may be used to form the ML mirror 1200 over the substrate 1100. IBD results in less perturbation and fewer defects in the upper surface of the ML mirror 1200 because the deposition conditions may be optimized to smooth over a defect on the substrate 1100. DC magnetron sputtering is more conformal, thus producing better thickness uniformity, but any defect on the substrate 1100 will tend to propagate up through the alternating layers to the upper surface of the ML mirror 1200.

Figure 1C:
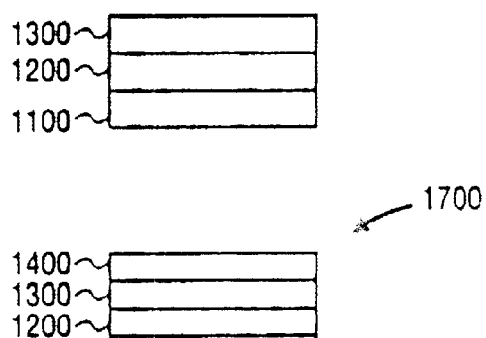

Third, a buffer layer 1300 is formed over the upper surface of the ML mirror 1200. An embodiment is shown in FIG. 1(c). The buffer layer 1300 may have a thickness of about 10–55 nm. The buffer layer 1300 may be formed from Silicon Dioxide, such as a low temperature oxide (LTO). A low process temperature, typically less than about 150 degrees C., is desirable to prevent interdiffusion of the alternating layers in the underlying ML mirror 1200. Other materials, such as Silicon Oxynitride or Carbon, may be used to form the buffer layer 1300. The buffer layer 1300 may be deposited by Radio Frequency (RF) magnetron sputtering.

Fourth, an absorber layer 1400 is formed over the buffer layer 1300. An embodiment is shown in FIG. 1(d). The absorber layer 1400 may be formed from about 45–125 nm of a material that will attenuate EUV light, remain stable during exposure to EUV light, and be compatible with the mask fabrication process. The absorber layer 1400 may be deposited with DC magnetron sputtering.

Various metals, alloys, and ceramics may be used to form the absorber layer 1400. Metals include Aluminum, Chromium, Nickel, Tantalum, Titanium, and Tungsten. Alloys include compounds of metals, such as Aluminum-Copper. Ceramics include compounds of metals and nonmetals, such as borides, carbides, nitrides, oxides, phosphides, silicides, and sulfides of metals. Examples include Nickel Silicide, Tantalum Boride, Tantalum Germanium, Tantalum Nitride, Tantalum Silicide, Tantalum Silicon Nitride, and Titanium Nitride.

Figure 2A:
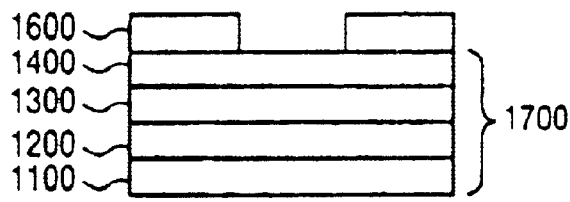
FIGS. 2(a)–(d) are illustrations of a cross-sectional view of an EUV mask formed according to the present invention.
Figure 2B:
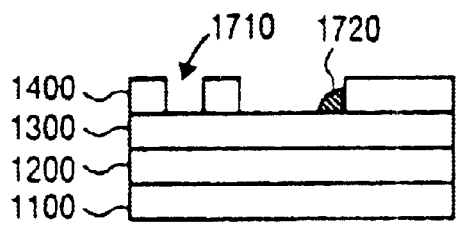
Figure 2C:
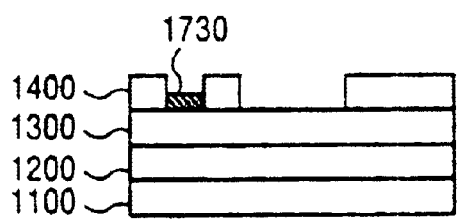
Figure 2D:
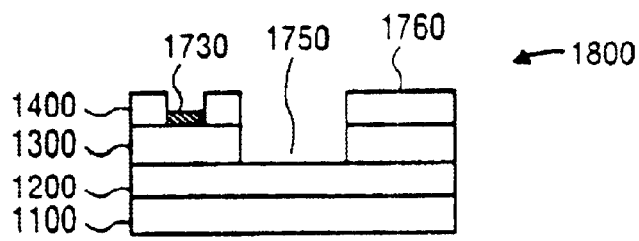

The combination of absorber layer 1400, buffer layer 1300, ML mirror 1200, and substrate 1100 results in an EUV mask blank 1700. An embodiment is shown in FIG. 1(d). The EUV mask blank 1700 shown in FIG. 1(d) may be further processed to produce an EUV mask 1800, an embodiment of which is shown in FIG. 2(d).

First, an EUV mask blank 1700 is covered with a radiation-sensitive layer, such as photoresist 1600. The photoresist 1600 has a thickness of about 160–640 nm. A chemically-amplified resist (CAR) may be used. A desired pattern is formed in the photoresist 1600 by selective exposure with sufficient radiation of the appropriate wavelength, such as DUV light or electron beam, followed by a wet or dry develop process. An embodiment is shown in FIG. 2(a). After developing the pattern in the photoresist 1600, the critical dimension (CD) of the features is measured with an optical tool or a scanning electron microscope (SEM).

Reactive ion etch (RIE) may be used to transfer the pattern from the photoresist 1600 into the underlying absorber layer 1400. For example, an absorber layer 1400 may be dry etched with a gas containing Chlorine, such as $Cl_2$ or $BCl_3$, or with a gas containing Fluorine, such as $NF_3$. Argon may be used as a carrier gas. In some cases, Oxygen may be included. The etch rate and the etch selectivity may be changed by modifying the configuration of the reactor chamber and adjusting parameters such as power, pressure, substrate temperature, and gas flowrate.

The buffer layer 1300 serves as an etch stop layer to help produce a good etch profile in the overlying absorber layer 1400. Furthermore, the buffer layer 1300 protects the underlying ML mirror 1200 from damage during the etch of the overlying absorber layer 1400. The buffer layer 1300 also protects the underlying ML mirror 1200 from damage during any subsequent repair to remove opaque defects in the absorber layer 1400.

After completing the etch, the photoresist 1600 is removed and the CD of the features formed in the absorber layer 1400 is measured with an optical tool or with a scanning electron microscope (SEM). Whenever appropriate, an interferometer may be used to measure the phase of the light signals in addition to the amplitude. Then the mask is inspected for defects with a microscope or an automated inspection tool. The mask inspection tools may combine optical techniques with scanning of the mask to acquire images. A laser producing UV/DUV light is usually used as the source of illumination. Typical wavelengths include, but are not limited to, 488 nm, 365 nm, 266 nm, 257 nm, 248 nm, 198 nm, and 193 nm. A shorter wavelength provides better resolution and may be a better predictor of the lithographic consequences of the defects that are found on the mask.

Defect inspection is generally performed by comparing two nominally identical patterns printed in different portions of a mask (die-to-die) or comparing a pattern printed on the mask and the corresponding layout data for the pattern (die-to-database). A defect may be found in the absorber layer 1400 after pattern transfer from the photoresist 1600. The defect may appear as a clear defect 1710 or as an opaque defect 1720. An embodiment is shown in FIG. 2 (b). In a clear defect 1710, the absorber layer 1400 should be present, but it is completely or partially missing. In an opaque defect 1720, the absorber layer 1400 should be absent, but it is completely or partially present.

A focused ion beam (FIB) tool may be used to cover a clear defect 1710 with an opaque material 1730, such as Carbon. A clear defect may also be repaired by ion beam-induced metal deposition from organometallic precursor gases. For example, Tungsten may be deposited from Tungsten Hexacarbonyl or $W(CO)_6$ gas. A post-deposition trim with gas-assisted etch (GAE) may be performed to eliminate any overspray and to achieve the desired post-repair size for the opaque material 1730. Bromine gas or Chlorine gas may be used in the GAE. The deposited opaque material 1730 need not have the same thickness as the chrome on a transmissive mask or the absorber layer 1400 on a reflective mask. The deposited opaque material 1730 should be compatible with the chemicals used to clean the mask.

The present invention envisions using electron beam-induced chemical etching to repair an opaque defect 1720 on a DUV mask or an EUV mask. Electron beam-induced chemical etching has high selectivity to underlying layers because it is essentially chemical, unlike FIB or GAE, which always have a physical component due to the ion bombardment. Unlike with the ion beam in FIB, an electron beam will not damage underlying layers by ion implantation or by knock-on of atoms. An embodiment is shown in FIG. 2(c).

In an EUV mask, a buffer layer 1300 covers and protects the ML mirror 1200 from damage during repair of the overlying absorber layer 1400. The thickness required for the buffer layer 1300 depends on the quantity of material that will be removed by the repair process. Consequently, a high etch selectivity allows the use of a thin buffer layer 1300 on an EUV mask. A thin buffer layer 1300 results in a lower overall absorber stack that reduces shadowing and improves imaging. A thin buffer layer 1300 also reduces the chances of generating printable soft defects during the removal of the buffer layer 1300 after completion of repair.

The buffer layer 1300 will increase light absorption over the ML mirror 1200 when the EUV mask 1800 is used to expose photoresist on a wafer. The result is a reduction in contrast that will slightly degrade CD control of the features printed in the photoresist on a wafer. In order to prevent this degradation, the buffer layer 1300 is removed wherever it is not covered by the absorber layer 1400.

The overlying absorber layer 1400 and the underlying ML mirror 1200 must not be damaged when the exposed portions of the buffer layer 1300 are removed. A buffer layer 1300 formed from Silicon Dioxide may be dry etched with a gas containing Fluorine, such as $CF_4$ or $C_5F_8$. In some cases, Oxygen and a carrier gas, such as Argon, may be included. Alternatively, a thin buffer layer 1300 may be wet etched since any undercut of the absorber layer 1400 would then be small. For example, a buffer layer 1300 formed from Silicon Dioxide may be etched with an aqueous solution of about 3–5% hydrofluoric acid. A combination of dry etch and wet etch may be used if desired.

The result of the process described above is an EUV mask 1800 having a reflective region 1750 and an anti-reflective, or dark, region 1760. An embodiment is shown in FIG. 2(d).

Figure 3:
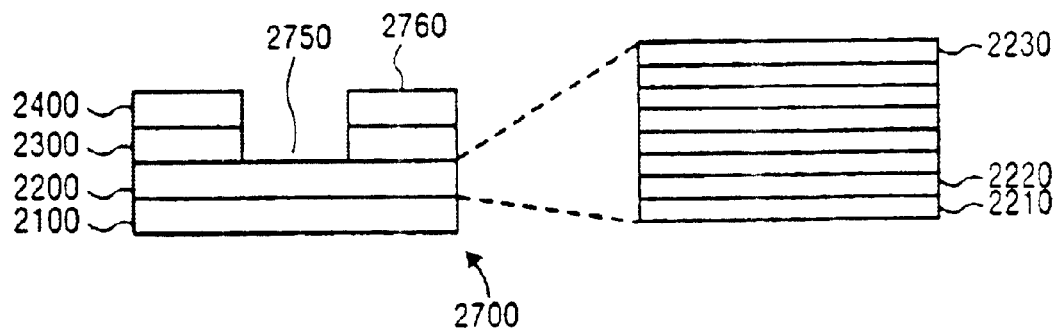
FIG. 3 is an illustration of a cross-sectional view of an EUV mask of the present invention.

Another embodiment of the present invention is an EUV mask 2700 as shown in FIG. 3. An EUV mask 2700 includes an absorber layer 2400, a thin buffer layer 2300, an ML mirror 2200, and a substrate 2100. The EUV mask 2700 has a first region 2750 and a second region 2760. The first region 2750 is reflective because the ML mirror 2200 is uncovered. The second region 2760 is antireflective, or dark, due to the absorber layer 2400.

First, the EUV mask 2700 of the present invention includes a substrate 2100, such as a glass-ceramic material, that has a low coefficient of thermal expansion (CTE), a low defect level, and a smooth surface.

Second, a multilayer (ML) mirror 2200 is disposed over the substrate 2100. The ML mirror 2200 has about 20–80 pairs of alternating layers of a high index of refraction material 2210 and a low index of refraction material 2220.

In one embodiment, the ML mirror 2200 includes 40 pairs of a high index of refraction material 2210 and a low index of refraction material 2220. The high index of refraction material 2210 may be about 2.8 nm thick Molybdenum while the low index of refraction material 2220 may be about 4.1 nm thick Silicon. The ML mirror 2200 has a peak reflectivity of about 60–75% at a central illumination wavelength of about 13.4 nm.

Third, an ultrathin buffer layer 2300 is disposed over the ML mirror 2200. The ultrathin buffer layer 2300 is about 10–55 nm thick. The ultrathin buffer layer 2300 protects the underlying ML mirror 2200 from any damage during the etch of the overlying absorber layer 2400. The ultrathin buffer layer 2300 also protects the underlying ML mirror 2200 from damage during repair to remove opaque defects.

The ultrathin buffer layer 2300 may be Silicon Dioxide, such as a low temperature oxide (LTO). Other materials, such as Silicon Oxynitride or Carbon may also be used for the ultrathin buffer layer 2300.

Fourth, an absorber layer 2400 is disposed over the ultrathin buffer layer 2300. The absorber layer 2400 may be about 45–125 nm of a material that will attenuate EUV light, remain stable during exposure to EUV light, and be compatible with the mask fabrication process.

The absorber layer 2400 may include one or more metals, alloys, and ceramics. Metals include Aluminum, Chromium, Nickel, Niobium, Tantalum, Titanium, and Tungsten. Alloys include compounds of metals, such as Aluminum-Copper. Ceramics are compounds formed from metals and nonmetals, such as borides, carbides, nitrides, oxides, or suicides of various metals. Examples include Nickel Silicide, Tantalum Boride, Tantalum Germanium, Tantalum Nitride, Tantalum Silicide, Tantalum Silicon Nitride, and Titanium Nitride.

Figure 4:
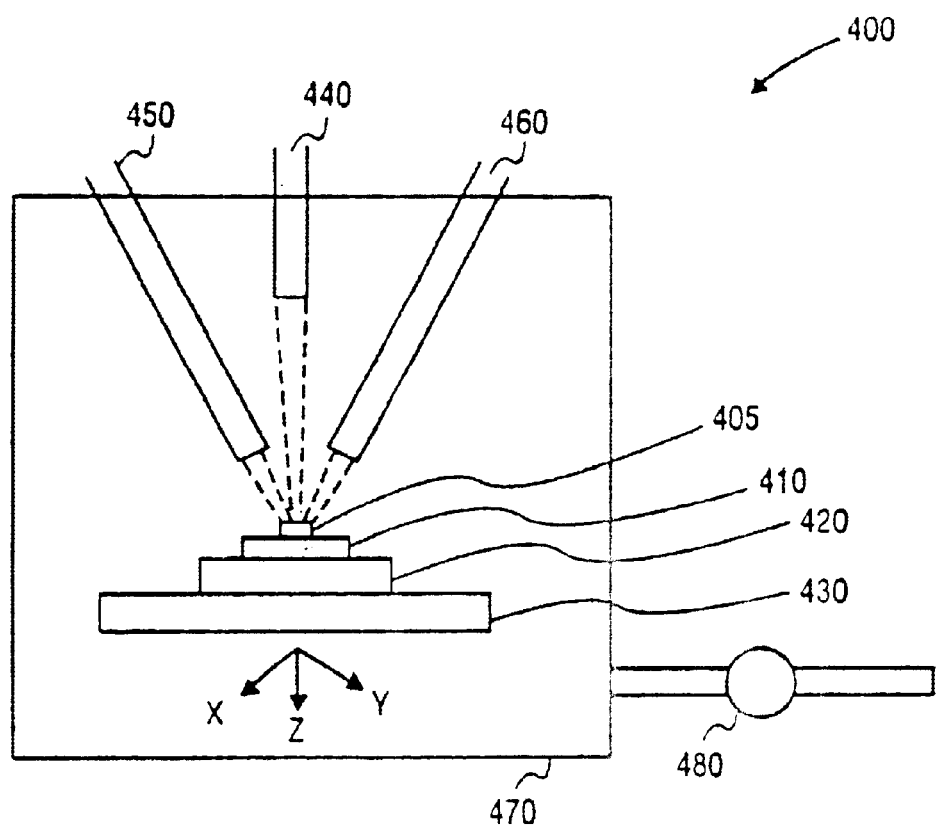
FIG. 4 is an illustration of a cross-sectional view of an apparatus for repairing opaque defects with electron beam-induced chemical etch according to the present invention.

The present invention further envisions an apparatus 400 to repair an opaque defect 405 on a DUV or EUV mask 410, by using electron beam-induced chemical etching. An embodiment is shown in FIG. 4.

In the apparatus 400 claimed in the present invention, a mask 410 to be repaired is mounted on a holder 420. The holder 420 is positioned in a chamber 470 by a stage 430. The stage 430 can rotate, tilt, and move in different directions, such as along the x-axis, y-axis, and z-axis. An imaging system 440 is used to locate an opaque defect 405 on the mask 410. The imaging system 440 may include an electron column.

A gas delivery system 450 dispenses one or more gases from reservoirs towards the opaque defect 405 on the substrate 410 in the chamber 470. The gases may be fed through one or more openings, such as nozzles, into the chamber 470. The desired flowrates are maintained by adjusting flow control valves.

Critical parameters include nozzle dimensions, tilt angle from nozzle to mask, angular dispersion of gas dispensed, and distance from the opening of the nozzle opening to the surface of the mask. Typical values include, but are not limited to, 100–300 microns (um) for nozzle diameter, 45–70 degrees (from vertical) for nozzle tilt angle, 5–25 degrees for angular dispersion, and 50–150 um for distance from the nozzle opening to the mask surface.

The gases may include reactant gases and carrier gases. The choice of reactant gases depends on the materials to be etched. In one embodiment of the present invention, the reactant gases adsorb to the opaque defect 405 and become dissociated. Argon is an example of a carrier gas.

In a DUV transmissive mask 410, an opaque defect 405 may include materials such as chrome, chrome oxide, chrome nitride, or chrome oxynitride. The underlying layer may include quartz. An electron delivery system 460 may be used to induce a reactant gas, such as chlorine ($Cl_2$) and oxygen ($O_2$), to chemically etch the opaque defect 405 relative to the underlying layer with a selectivity of 2:1 or more.

In an EUV reflective mask 410, an opaque defect 405 may include absorber layer material such as Tantalum Nitride. The underlying layer may include buffer layer material such as Silicon Dioxide. An electron delivery system 460 may be used to induce a reactant gas, such as Xenon Fluoride ($XeF_2$) or Carbon Tetrafluoride ($CF_4$) or Fluorine ($F_2$), to chemically etch the opaque defect 405 relative to the underlying layer with a selectivity of 10:1 or more. Volatile byproducts, such as Tantalum Fluoride, may be removed from the chamber 470 by a pumping system 480.

When an opaque defect 405 includes a Carbon-containing material, an electron delivery system 460 may be used to induce a reactant gas, such as water vapor ($H_2O$) or Oxygen ($O_2$), to chemically etch the opaque defect 405 relative to the underlying layer with a selectivity of 10:1 or more. For example, a Carbon etch may be used to repair an opaque defect 405 on an EUV mask 410 that has a conductive buffer layer containing Carbon. A Carbon etch may also be used to repair an opaque defect 405 in a photoresist pattern on a mask 410 to increase the patterning yield and to reduce rework. Furthermore, a Carbon etch may be helpful in the more difficult repair that is required after a mask 410 has gone through additional processing.

The electron delivery system 460 used to induce chemical etching may resemble an electron column used to image a sample in a SEM except that the focusing and scanning controls for the electron beam are more sophisticated. In particular, critical parameters, such as beam current, pixel spacing, dwell time, scan rate, refresh time, and retrace time, may be controlled by a computer to optimize etch rate, etch geometry, etch uniformity, and surface roughness.

The electron delivery system 460 directs electrons towards the opaque defect 405 on the mask 410 in the chamber 470. The electron delivery system 460 may include a focusing system to provide a highly focused electron beam. In one embodiment, highly focused means that the electron beam size is smaller than the range of the secondary electrons. In another embodiment, highly focused means that the electron beam size is smaller than about 30% of the size of the smallest critical defect to be repaired. In general, an electron beam has a typical tail diameter of about 5–125 nm.

The electron delivery system 460 uses a low acceleration voltage, such as in the range of 0.3–3.0 keV, to limit the lateral spread of emitted electrons at the surface of the mask 410. A low voltage also minimizes surface charging. The emitted electrons include secondary electrons and backscattered electrons. A chemical etch of an opaque defect 405 is induced when secondary electrons interact with the reactant gas that is adsorbed and dissociated on the surface of the mask 410. If desired, the secondary electron current may be monitored to detect the etch endpoint.

In most cases, the electron beam-induced chemical etch is reaction-limited and not mass transfer-limited. The chemical etching of the opaque defect 405 by the reactant gas produces volatile byproducts that dissociate from the mask and may be removed from the chamber 470 holding the mask 410. A pumping system 480 evacuates gases and volatile materials from the chamber 470, thus creating a vacuum inside the chamber 470.

The electron beam-induced chemical etch rate of the opaque defect 405 depends on the partial pressure of the reactant gas and the current density of the electron beam. The pressure in the chamber 470 may be about 0.001–0.200 milliTorr (mT) globally and about 0.500–10.000 mT locally over the opaque defect 405 being repaired on the mask 405. The beam current may be about 0.050–1.000 nanoAmperes (nA). The electron beam-induced chemical etch rate usually depends on the yield of the secondary electrons. The etch rate is usually at a maximum for an acceleration voltage of about 1.0 keV or less.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described an apparatus for and a method of fabricating and repairing a mask without damage.

We claim:

1. A method comprising:

providing a substrate;

forming a layer over said substrate;

patterning said layer into a first region and a second region;

removing said layer in said first region;

inspecting said first region for an opaque defect;

forming a reactant gas over said opaque defect; and directing electrons toward said opaque defect, said electrons inducing said reactant gas to etch said opaque defect without ion bombardment.

2. The method of claim 1 wherein said reactant gas etches said opaque defect without damage to said substrate.

3. The method of claim 1 wherein said opaque defect comprises chrome and said reactant gas comprises chlorine and oxygen.

4. A method comprising:

providing a substrate;

forming a mirror over said substrate;

forming a buffer layer over said mirror;

forming an absorber layer over said buffer layer;

patterning said absorber layer into a first region and a second region;

removing said absorber layer in said first region;

inspecting said first region for an opaque defect;

dispensing a reactant gas over said opaque defect; and scanning an electron beam over said opaque defect, said electron beam inducing said reactant gas to react with said opaque defect without ion bombardment to form a volatile byproduct.

5. The method of claim 4 wherein said opaque defect comprises an absorber and said reactant gas comprises Xenon Fluoride ($XeF_2$).

* * * * *